(12) United States Patent
Matsumoto

(10) Patent No.: US 8,070,910 B2
(45) Date of Patent: Dec. 6, 2011

(54) SHOWER HEAD STRUCTURE AND TREATING DEVICE

(75) Inventor: Kenji Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/642,363

(22) Filed: Dec. 18, 2009

(65) Prior Publication Data

US 2010/0096083 A1    Apr. 22, 2010

Related U.S. Application Data

(60) Division of application No. 11/246,302, filed on Oct. 11, 2005, now abandoned, which is a continuation of application No. PCT/JP2004/005172, filed on Apr. 9, 2004.

(30) Foreign Application Priority Data

Apr. 10, 2003  (JP) ................................. 2003-107031

(51) Int. Cl.
*C23F 1/00* (2006.01)
*H01L 21/306* (2006.01)

(52) U.S. Cl. ................................. 156/345.34

(58) Field of Classification Search .............. 156/345.34
See application file for complete search history.

(56) References Cited

U.S. PATENT DOCUMENTS

| 4,580,908 A | 4/1986 | Stewen |
| 5,741,363 A | 4/1998 | Van Buskirk et al. |
| 6,755,932 B2 * | 6/2004 | Masuda et al. ........... 156/345.24 |

FOREIGN PATENT DOCUMENTS

| JP | 58-6124 | 1/1983 |
| JP | 5-152208 | 6/1993 |
| JP | 10-109124 | 4/1998 |
| JP | 11-45859 | 2/1999 |
| JP | 2004-79985 | 3/2004 |

OTHER PUBLICATIONS

English translation of JP 05-152208 by Oba Takayuki.

* cited by examiner

*Primary Examiner* — Ram Kackar
*Assistant Examiner* — Keath Chen
(74) *Attorney, Agent, or Firm* — Oblon, Spivak, McClelland, Maier & Neustadt, L.L.P.

(57) ABSTRACT

A shower head structure characterized by comprising a shower head section, opposed to the upper surface of a mounting table in an evacuable treating vessel, for injecting a processing gas into the treating vessel; a temperature observation through-hole which opens in the lower surface of the shower head so as to be opposed to the upper surface of the mounting table, a transparent observation window which hermetically seals the upper end of the temperature observation through-hole, a radiation thermometer disposed on the upper surface of the transparent observation window, an adhesion preventive gas supply path communicating with the temperature observation through-hole to prevent a film from adhering to the transparent observation window, wherein the adhesion preventive gas supply path communicates with the temperature observation through-hole through an injection nozzle for injecting the adhesion preventive gas to the transparent observation window.

4 Claims, 13 Drawing Sheets

SHOWER HEAD STRUCTURE AND TREATING DEVICE

CROSS-REFERENCE TO RELATED APPLICATIONS

This is a divisional application of pending U.S. application Ser. No. 11/246,302, filed on Oct. 11, 2005, the entire content of which is incorporated herein by reference. U.S. application Ser. No. 11/246,302 claims domestic priority to PCT/JP2004/005172 filed on Apr. 9, 2004, and foreign priority Japanese Patent Application No. 2003-107031 filed on Apr. 10, 2003.

FIELD OF THE INVENTION

The present invention relates to a shower head structure and a processing device for performing a heat treatment such as a film forming processing of, e.g., a metal oxide film, or an etching processing or the like, on an object to be processed such as a semiconductor wafer or the like.

BACKGROUND OF THE INVENTION

Generally, for producing a desired semiconductor device, a heat treatment such as a film forming processing or a pattern etching processing or the like is repeatedly performed on a semiconductor wafer. With a recent trend towards high-density and high-integration of a semiconductor device, a strict heat treatment method has been demanded. For example, for a very thin oxide film such as an insulating film of a capacitor or a gate insulating film in the device, the film is also required to be more thin, and at the same time, to have more superior insulation property.

As for such an insulating film, a silicon oxide film, a silicon nitride film or the like has been used. Recently, a metal oxide film, e.g., a tantalum oxide ($Ta_2O_5$) or the like, is preferably used as a material having further improved excellent insulation characteristic (e.g., Japanese Patent Laid-open Application No. H2-283022). The metal oxide film shows reliable high insulation property even though it is thin as an oxide film conversion film.

For forming a metal oxide film having good characteristics, temperature of the semiconductor wafer needs to be very accurately controlled during the film formation. For example, a case of forming a tantalum oxide will be explained. First, a semiconductor wafer is loaded into a film forming device. As disclosed in the aforementioned application, a metal alkoxide ($Ta(O_2H_5)_5$) of tantalum is used as a source for film formation. The metal alkoxide ($Ta(O_2H_5)_5$) is supplied into the film forming device while being bubbled by nitrogen gas or the like. Meanwhile, the semiconductor wafer is maintained at a process temperature of, e.g., about 450° C. Further, a tantalum oxide ($Ta_2O_5$) film is deposited on the semiconductor wafer by CVD (Chemical Vapor Deposition) under a vacuum atmosphere.

As for another kind of film, an oxide film containing a plurality of metal components, i.e., so-called a multi-component metal oxide thin film, is used as a nonvolatile memory since it has ferroelectricity. As a typical example of the multi-component metal oxide thin film, a PZT film (oxide film of Pb, Zr and Ti) has been known.

In case when forming a metal oxide film, a complex metallic material film or the like, it is preferable to conduct a temperature management on the wafer. In a conventional device, a thermocouple as a temperature detection unit is provided in a mounting table (susceptor) for mounting thereon a wafer, and the temperature of the wafer is indirectly detected. Based on this detection value, an output of a heating unit such as a heating lamp, a heater or the like is controlled to thereby control the temperature of the wafer.

However, what the aforementioned thermocouple directly detects is the temperature of the mounting table, not that of the wafer as described above. Thus, a real temperature of the wafer can somewhat differ from the detection value.

For the same reason, e.g., Japanese Patent Laid-open Application No. H8-264472, Japanese Patent Laid-open Application No. H11-45859, Japanese Patent Laid-open Application No. H5-152208 and the like disclose that the temperature of the wafer is measured by using a radiation thermometer without using the thermocouple. The radiation thermometer detects temperature of an object by measuring radiation brightness in a specific wavelength band from the object. By using the radiation thermometer, it is possible to directly measure the temperature of the wafer accurately without making any direct contact with the object.

However, if a residual thin film is deposited to be adsorbed on a surface of a light detector of the radiant thermometer on which an incident light of specific wavelength band from the wafer is to be illuminated, the light is absorbed by the thin film, and therefore, the radiant thermometer cannot measure the temperature of the wafer accurately. Thus, for the purpose of preventing an unnecessary thin film from being deposited on the surface of the light detector, which is exposed to a processing space while a film forming processing is performed on the wafer (or on a surface of a transparent glass plate or the like, for partitioning the incident surface from the processing space), it is preferable to supply a nonreactive gas into an observation hole, to which the radiant thermometer is attached, thereby purging a film forming gas.

However, if the nonreactive gas for preventing the deposition of the thin film is introduced into the processing space, a partial pressure of a source gas needed for forming, e.g., a metal oxide film (e.g., a source gas for pentoethoxytantalum or PZT) is lowered. As a result, a film thickness of a portion, into which the nonreactive gas is introduced, is changed, so that uniformity in the film thickness of in-surface of the wafer becomes deteriorated. Further, an increase in the amount of nonreactive gas to be used is problematic.

SUMMARY OF THE INVENTION

The present invention is contrived on the basis of the aforementioned problems and is to solve them effectively.

It is, therefore, an object of the present invention to provide a shower head structure and a processing device capable of keeping a performance of a radiant thermometer with a small amount of nonreactive gas for purging without lowering in-surface uniformity of a film thickness, in case of using the radiant thermometer for measuring a temperature of an object to be processed.

In accordance with one aspect of the present invention, there is provided a shower head structure including: a shower head section provided to face a top surface of a mounting table in an evacuatable treating vessel; a multiplicity of gas injection holes, opened in a lower surface of the shower head section, for injecting a processing gas into the treating vessel; a temperature observation through hole opened in the lower surface of the shower head section to face the top surface of the mounting table; a transparent observation window for airtightly sealing an upper portion of the temperature observation through hole; a radiant thermometer provided at a top surface side of the transparent observation window; and an adhesion preventive gas supply path, communicating with the temperature observation through hole, for supplying thereinto an adhesion preventive gas, which prevents a film from being deposited on the transparent observation window, wherein the adhesion preventive gas supply path communicates with the temperature observation through hole through an injection nozzle unit for injecting the adhesion preventive gas towards the transparent observation window.

In accordance with the present invention, since the adhesion preventive gas is injected towards the transparent observation window through the injection nozzle unit, it is possible to effectively prevent the surface of the transparent observation window from making a contact with the processing gas, even though the flow rate of the adhesion preventive gas is small. Thus, it is possible to prevent an unnecessary film, which may interfere with temperature measurement or detection of an object to be processed, from being deposited on the surface of the transparent observation window. Further, it is possible to remarkably suppress the adhesion preventive gas from affecting the processing on the object. For example, in case of a thin film forming processing on the surface of the object, in-surface uniformity in a film thickness can be maintained high.

Preferably, the injection nozzle unit may be formed of an injection hole for adhesion preventive gas, which is formed by boring the shower head section, and the transparent observation window may be disposed in an extension direction of an end portion of the injection hole for adhesion preventive gas.

Further, it is preferable that the injection nozzle unit is formed of a gas injection pipe made of a transparent material, which is provided in the temperature observation through hole, and the transparent observation window may be disposed to be fixed in an extension direction of an end portion of the gas injection pipe. In this case, preferably, the gas injection pipe may be made of a quartz glass.

In accordance with another aspect of the present invention, there is provided a shower head structure including: a shower head section provided to face a top surface of a mounting table in an evacuatable treating vessel; a multiplicity of gas injection holes, opened in a lower surface of the shower head section, for injecting a processing gas into the treating vessel; a temperature observation through hole opened in the lower surface of the shower head section to face the top surface of the mounting table; a transparent observation window for airtightly sealing an upper portion of the temperature observation through hole; a radiant thermometer provided at a top surface side of the transparent observation window; and an adhesion preventive gas supply path, communicating with the temperature observation through hole, for supplying thereinto an adhesion preventive gas, which prevents a film from being deposited on the transparent observation window, wherein the adhesion preventive gas supply path communicates with the temperature observation through hole through an annular gas diffusion groove surrounding an upper portion of the temperature observation through hole.

In accordance with the present invention, since the adhesion preventive gas is diffused by the gas diffusion groove to make a contact with the transparent observation window, it is possible to effectively prevent the surface of the transparent observation window from making a contact with the processing gas, even though the flow rate of the adhesion preventive gas is small. Thus, it is possible to prevent an unnecessary film, which may interfere with a temperature measurement or detection of an object to be processed, from being deposited on the surface of the transparent observation window. Further, it is possible to remarkably suppress the adhesion preventive gas from affecting the processing on the object. For example, in case of a thin film forming processing on the surface of the object, in-surface uniformity in a film thickness can be maintained high.

It is preferable that a gas in the gas diffusion groove has a contact with the transparent observation window since the gas diffusion groove is opened towards the transparent observation window. In this case, more preferably, the gas diffusion groove may communicate with the temperature observation through hole in an entire inner peripheral side thereof through an inner bank.

In accordance with still another aspect of the present invention, there is provided a shower head structure including: a shower head section provided to face a top surface of a mounting table in an evacuatable treating vessel; a multiplicity of gas injection holes, opened in a lower surface of the shower head section, for injecting a processing gas into the treating vessel; a temperature observation through hole opened in the lower surface of the shower head section to face the top surface of the mounting table; a transparent observation window for airtightly sealing an upper portion of the temperature observation through hole; a radiant thermometer provided at a top surface side of the transparent observation window; and an adhesion preventive gas supply path, communicating with the temperature observation through hole, for supplying thereinto an adhesion preventive gas, which prevents a film from being deposited on the transparent observation window, wherein a gas flow prevention plate, made of a transparent material, for preventing a back flow of a gas is installed below a part, in which the adhesion preventive gas supply path communicates with the temperature observation through hole.

In accordance with the present invention, the gas flow prevention plate is installed below a part, in which the adhesion preventive gas supply path communicates with the temperature observation through hole, so that the surface of the transparent observation window can be prevented effectively from making a contact with the processing gas, even though the flow rate of adhesion preventive gas is small. Thus, it is possible to prevent an unnecessary film, which may interfere with a temperature measurement or detection of an object to be processed, from being deposited on the surface of the transparent observation window. Further, it is possible to remarkably suppress the adhesion preventive gas from affecting the processing on the object. For example, in case of a thin film forming processing on the surface of the object, in-surface uniformity in a film thickness can be maintained high.

It is preferable that, in the gas flow prevention plate, plural fine gas injection holes are formed.

Further, it is preferable that the gas flow prevention plate is made of a quartz glass.

In accordance with still another aspect of the present invention, there is provided a shower head structure including: a shower head section provided to face a top surface of a mounting table in an evacuatable treating vessel; a multiplicity of gas injection holes, opened in a lower surface of the shower head section, for injecting a processing gas into the treating vessel; a temperature observation through hole opened in the lower surface of the shower head section to face the top surface of the mounting table; a transparent observation window for airtightly sealing an upper portion of the temperature observation through hole; a radiant thermometer provided at a top surface side of the transparent observation window; and an adhesion preventive gas supply path, communicating with the temperature observation through hole, for supplying thereinto an adhesion preventive gas, which prevents a film from being deposited on the transparent observation window, wherein a gas discharge passage, communicating with the temperature observation through hole, for discharging the adhesion preventive gas supplied from the adhesion preventive gas supply path into the temperature observation through hole, is installed.

In accordance with the present invention, a gas discharge passage for discharging the adhesion preventive gas supplied from the adhesion preventive gas supply path into the temperature observation through hole is installed, so that it is possible to effectively prevent the surface of the transparent observation window from making a contact with the processing gas, even though the flow rate of the adhesion preventive gas is small. Further, it is possible to remarkably suppress the adhesion preventive gas from affecting the processing on the object through the temperature observation through hole. For example, in case of a thin film forming processing on the surface of the object, in-surface uniformity in a film thickness can be maintained high.

Preferably, one part communicating with the temperature observation through hole of the adhesion preventive gas supply path may be aligned in a straight line with another part communicating with the temperature observation through hole of the gas discharge passage. In this case, it is preferable that one angle formed by the one part communicating with the temperature observation through hole of the adhesion preventive gas supply path and the temperature observation through hole, and another angle formed by the another part communicating the temperature observation through hole of the gas discharge passage and the temperature observation through hole are 45~90 degrees, respectively.

Otherwise, in an inner wall of the temperature observation through hole, there may be formed a gas guiding recess portion for converting a flow direction of the adhesion preventive gas supplied from the adhesion preventive gas supply path, thereby guiding the adhesion preventive gas to the gas discharge passage.

Further, the gas discharge passage may be configured to discharge the adhesion preventive gas towards an outer region of the mounting table in the treating vessel.

Alternatively, the gas discharge passage may be configured to discharge the adhesion preventive gas towards an exhaust passage outside the treating vessel.

Further, it is preferable that a second adhesion preventive gas supply path for supplying the adhesion preventive gas into the temperature observation through hole is installed in the temperature observation through hole above a portion communicating with the adhesion preventive gas supply path. In this case, a flow rate of the adhesion preventive gas supplied from the second adhesion preventive gas supply path into the temperature observation through hole may be set to be smaller than that of the adhesion preventive gas supplied from the adhesion preventive gas supply path into the temperature observation through hole.

The adhesion preventive gas may be a nonreactive gas. Further, the adhesion preventive gas may be a gas used for the processing gas.

In accordance with still another aspect of the present invention, there is provided a processing device, including: an evacuatable treating vessel; a mounting table, provided in the treating vessel, for mounting thereon an object to be processed; a heating unit for heating the object; the shower head structure described in any one of claims 1 to 20; and a control unit for controlling the heating unit based on a measurement value of a radiant thermometer of the shower head structure.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Hereinafter, preferred embodiments of a shower head structure and a processing device in accordance with the present invention will be described with reference to the accompanying drawings.

First Embodiment

Figure 1:
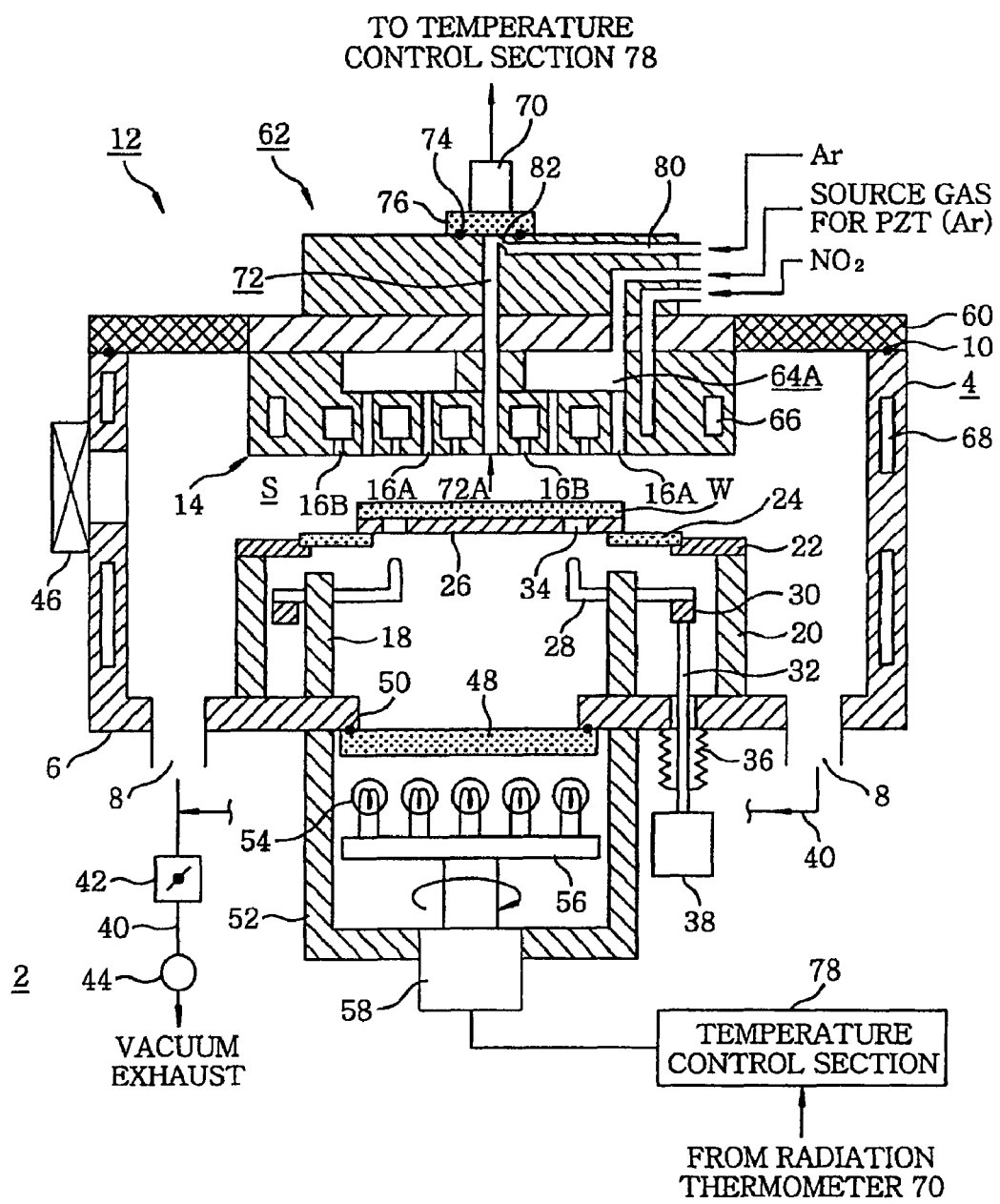
FIG. 1 offers a cross sectional configuration view showing a processing device having a shower head structure in accordance with a first embodiment of the present invention.
Figure 2:
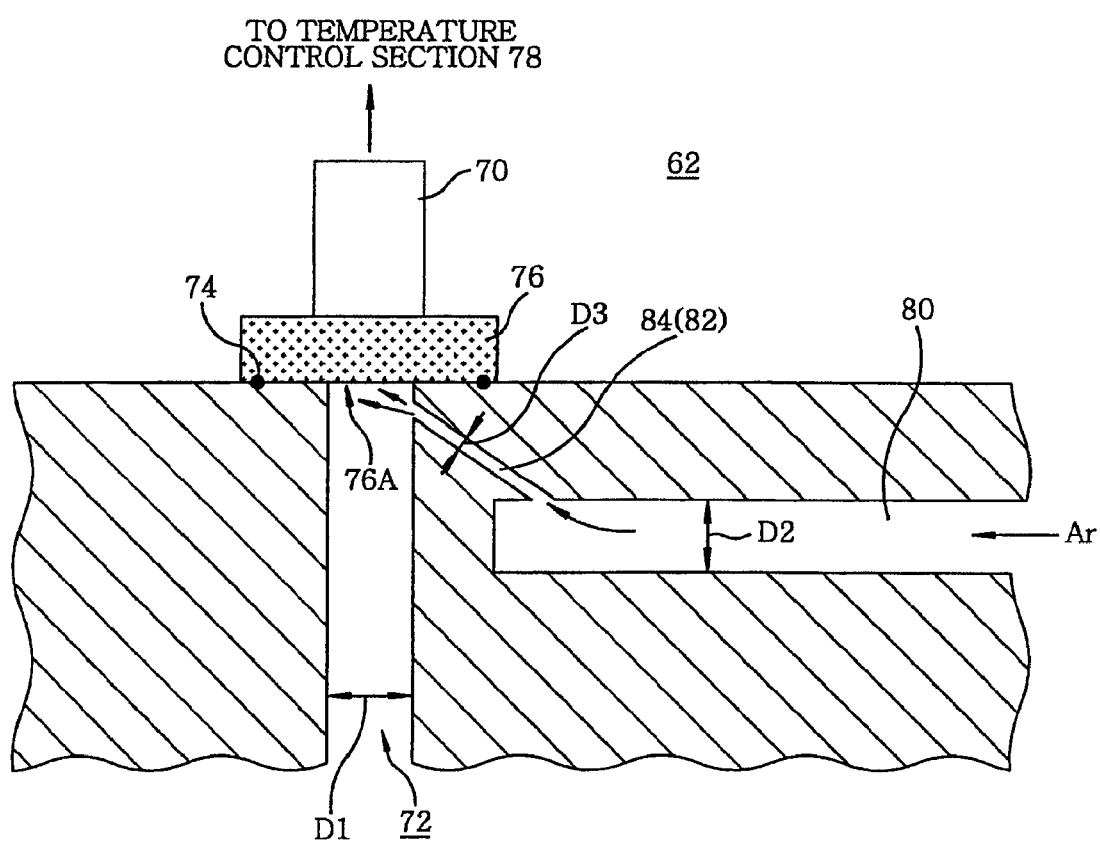
FIG. 2 is a magnified cross sectional view showing a part of the shower head structure shown in FIG. 1.

FIG. 1 is a cross sectional configuration view showing a processing device having a shower head structure in accordance with a first embodiment of the present invention; and FIG. 2 is a magnified cross sectional view showing a part of the shower head structure shown in FIG. 1. Herein, as a heat treatment, a case of forming a PZT film of a metal oxide film by CVD will be discussed as an example.

As illustrated in FIG. 1, a processing device 2 has a cylindrical treating vessel 4 made of, e.g., aluminum. A gas exhaust port 8 is installed at a bottom portion 6 of the treating vessel 4. An inside of the treating vessel 4 is configured to be vacuum-exhausted through the gas exhaust port 8. At a ceiling portion of the treating vessel 4, a shower head structure 12 is installed through a sealing member 10 such as an O-ring or the like. A multiplicity of gas injection holes 16A and 16B is provided in a gas injection surface 14 of a lower surface of the shower head structure 12. Accordingly, various kinds of processing gases are injected towards a processing space S in the treating vessel 4 through the multiplicity of gas injection holes 16A and 16B.

In the treating vessel 4, there is installed a cylindrical reflector 18 uprightly from the bottom portion 6 of the treating vessel 4. In the same manner, a cylindrical supporting barrel 20 made of, e.g., aluminum, is concentrically installed with the reflector 18 at an outer peripheral side of the reflector 18.

On an upper portion of the supporting barrel 20, a circular ring-shaped adhesion member 22 made of, e.g., aluminum, is attached to be fixed thereon. Further, at an inner peripheral side of the circular ring-shaped adhesion member 22, there is installed a support member 24 formed in a circular ring shape, a radius of which is smaller than that of the circular ring-shaped adhesion member 22. The support member 24 is made of a colored material of a low thermal conductivity to effectively shut off heat rays irradiated from a heating lamp that will be explained later. Further, an inner peripheral portion of the support member 24 makes a direct contact with a peripheral portion of a mounting table 26 made of, e.g., SiC, thereby supporting the mounting table 26. Still further, a semiconductor wafer W as an object to be processed is mounted on the mounting table 26.

Below the mounting table 26, multiple, e.g., three L-shaped lifter pins 28 (only two shown in the drawing) are installed to stand uprightly. Respective base units of the lifter pins 28 penetrate through insertion penetration holes (not shown) longitudinally formed in the reflector 18 such that they can be vertically moved and are commonly connected to a ring member 30 at the outside of the reflector 18. The ring member 30 is configured to be vertically moved by an upthrust rod 32 penetrating through the bottom portion 6 of the treating vessel 4. Thus, tip ends of the lifter pins 28 are inserted into lifter pin through holes 34, which are provided in the mounting table 26, to penetrate therethrough, respectively, to thereby lift the wafer W.

Between a lower portion of the upthrust rod 32 and the lower surface of the bottom portion 6, an expansible/contractible bellows 36 is installed to keep an airtight state of the treating vessel 4. A lower end of the upthrust rod 32 is coupled to an actuator 38.

An exhaust passage 40 is coupled to the gas exhaust port 8 provided at the peripheral bottom portion of the treating vessel 4. In the exhaust passage 40, a pressure control valve 42, e.g., a butterfly valve, and a vacuum pump 44 are sequentially installed. Accordingly, the inside of the treating vessel 4 is vacuum-exhausted while the pressure thereof is controlled. Further, at a sidewall of the treating vessel 4, a gate valve 46 that can be opened or closed during a loading or unloading of the wafer is installed.

At the bottom portion 6 of the vessel right below the mounting table 26, a bottom portion opening of a large diameter is provided. In the bottom portion opening, there is airtightly installed a transmission window 48 made of a heat ray transmission material such as quartz or the like, through a sealing member 50, e.g., an O-ring or the like. Below the transmission window 48, a box shaped heating chamber 52 is installed to surround the transmission window 48. In the heating chamber 52, e.g., a plurality of heating lamps 54 as a heating unit is equipped on a turntable 56 that can be commonly shared as a reflection mirror. The turntable 56 is rotated by a rotation motor 58 provided at a bottom portion of the heating chamber 52, through a rotation axis. Heat rays emitted from the heating lamps 54 penetrate through the transmission window 48 to be irradiated to a lower surface of the thin mounting table 26. Accordingly, the mounting table 26 is heated, and the wafer W on the mounting table 26 is indirectly heated.

Meanwhile, the shower head structure 12 provided at the ceiling portion of the treating vessel 4 faces almost an entire top surface of the mounting table 26. Therefore, a processing space S is formed between the mounting table 26 and the shower head structure 12. The shower head structure 12 includes a ceiling plate 60, and a shower head section 62 attached to a center of the ceiling plate 60. The shower head section 62 is formed by properly airtightly combining and joining a plurality of plate-shaped aluminum blocks and the like together, on which a boring processing or the like has been carried out.

In the shower head section 62, a head space 64A for source gas and a head space 64B for assist gas are formed independently. Into the head space 64A for source gas, there is introduced as a source gas a complex metallic material of vaporized state, e.g., a source gas for PZT, which is vaporized by a carrier gas formed of a nonreactive gas, e.g., argon or the like, while a flow rate thereof being controlled. Further, into the head space 64B for assist gas, e.g., $NO_2$ of an oxide gas is introduced herein as an assist gas for performing a film forming reaction while a flow rate thereof being controlled. Still further, the aforementioned gas injection holes 16A and 16B are divided into two groups of the source gas injection holes 16A communicating with the head space 64A for source gas and the assist gas injection holes 16B communicating with the head space 64B for assist gas, respectively. During the film formation, the source gas and assist gas ($NO_2$) respectively injected from the gas injection holes 16A and 16B are mixed in the processing space S (so-called a post mix).

Further, in the sidewall of the shower head section 62, there is installed a heater 66 for heating the sidewall to a temperature of about, e.g., 150~250° C., to prevent the source gas from being liquefied or decomposed. Still further, in the sidewall of the treating vessel 4, there is also installed a heater 68 for heating the sidewall to a temperature of about, e.g., 150~250° C., so as to prevent a source gas from being liquefied or decomposed.

A temperature observation through hole 72 is provided in the shower head section 62 to penetrate therethrough in a direction aligning an upper portion with a lower portion (substantially vertical direction). An opening 72A of a lower portion of the temperature observation through hole 72 is configured to face the surface of the wafer W disposed on the mounting table 26, in a substantially normal direction. The temperature observation through hole 72 may be disposed at a substantially central position of the shower head section 62, or at a position radially shifted (eccentric) from the center by some distance. An inner diameter D1 (see FIG. 2) of the temperature observation through hole 72 in the present embodiment is about 13 mm. Further, the inside of the temperature observation through hole 72 is airtightly separated from the head space 64A for source gas and the head space 64B for assist gas.

A transparent observation window 76 made of a heat resistant transparent material is airtightly attached to an opening of the upper portion of the temperature observation through hole 72, through a heat resistant sealing member 74 such as an O-ring or the like. Heat rays from the surface of the wafer W pass through the transparent observation window 76. The transparent observation window 76 is made of, e.g., a transparent quartz glass. Outside the transparent observation window 76, a radiant thermometer 70 is provided to be securely fixed. The radiant thermometer 70 detects the temperature of the wafer W by detecting the heat rays from the surface of the wafer W. A detection value of the radiant thermometer 70 is inputted to a temperature control section 78 formed of, e.g., a microcomputer and the like. The temperature control section 78 controls the temperature of the wafer W by, e.g., controlling a power inputted to the heating lamps 54, based on the detection value.

Further, in the shower head section 62, there is formed by, e.g., a boring processing, an adhesion preventive gas supply path 80 for supplying the nonreactive gas for purging, e.g., Ar gas, from the side of the shower head section 62 into the temperature observation through hole 72, while the flow rate thereof being controlled. Still further, at an end portion of the adhesion preventive gas supply path 80, an injection nozzle unit 82 for injecting Ar gas towards an inner surface 76A of the transparent observation window 76 is installed. In the present embodiment, the injection nozzle unit 82 has therein a purge injection hole 84 of a small inner diameter, which is formed by slantingly boring the shower head section 62 from an end portion of the adhesion preventive gas supply path 80 to the vicinity of the transparent observation window 76. The transparent observation window 76 is placed at the extension direction of the purge injection hole 84. In this case, an inner diameter D2 of the adhesion preventive gas supply path 80 is about 6~9 mm; and an inner diameter D3 of the injection nozzle unit 82 is within the range of about 2~3 mm, which is substantially narrow. Accordingly, a gas velocity of Ar gas to be injected may be maintained at a specific value or higher, even though the flow rate of Ar gas is somewhat small.

In the following, a processing method performed by using the processing device configured above will be explained.

First, an unprocessed semiconductor wafer W is loaded into the treating vessel 4, which is kept at a vacuum state, through the gate valve 46, while opened, from a transfer chamber or a load-lock chamber (not shown) side. By raising or lowering the lifter pins 28, the wafer W is mounted on the mounting table 26. Further, the inside of the treating vessel 4 is vacuum-exhausted to be kept at a predetermined process pressure; and the heating lamps 54 are operated to heat the semiconductor wafer W to a specified temperature to be maintained thereat. Meanwhile, a source gas and an $NO_2$ gas are supplied into the processing space S from the shower head section 62 of the shower head structure 12. Thus, a film forming processing of a metal oxide film is carried out.

In this case, e.g., a source solution for PZT formation is supplied as a source gas, which is vaporized by a vaporizer using the Ar gas. Preferably, such a supply system may be pre-heated at a predetermined temperature, e.g., about 200° C., to prevent the source gas from being re-liquefied. The source gas introduced into the head space 64A for source gas of the shower head section 62 is supplied into the processing space S through the source gas injection holes 16A provided in the gas injection surface 14.

On the other hand, the $NO_2$ gas supplied into the head space 64B for assist gas of the shower head section 62 is supplied into the processing space S through the assist gas injection holes 16B provided in the gas injection surface 14.

As described above, the source gas and the $NO_2$ gas supplied into the processing space S are mixed therein to react with each other such that, e.g., a PZT film is deposited on the wafer surface.

Wherein, the temperature of the wafer is within the range of 400~650° C., e.g., about 500° C. And, the surface temperature of the shower head section 62 is about, e.g., 200° C.

Herein, a light from the surface of the wafer W passes the temperature observation through hole 72 provided in the shower head section 62 to be transmitted through the transparent observation window 76, thereby being detected by the radiant thermometer 70. Therefore, the temperature of the wafer is measured by the radiant thermometer 70. The temperature of the wafer measured by the radiant thermometer 70 is inputted to the temperature control section 78. Based on this inputted temperature of the wafer, the temperature control section 78 controls an output of the heating lamps 54, so that the temperature of the wafer is controlled to be kept at a predetermined value.

Under such a circumstance, the source gas or the $NO_2$ gas introduced into the processing space S diffuses backward into the temperature observation through hole 72, and thus, an unnecessary opaque film becomes deposited on a lower surface of the transparent observation window 76, so that a detection value of the temperature of the wafer by the radiation thermometer 70 may become inaccurate. However, in the present embodiment, since the Ar gas as a nonreactive gas is injected to the lower surface of the transparent observation window 76, the lower surface can be prevented from having an unnecessary film to be deposited thereon. Namely, since the nonreactive gas, e.g., Ar gas, is supplied into the adhesion preventive gas supply path 80 formed in the shower head section 62 while the flow rate thereof being controlled, and the Ar gas is injected towards the lower surface of the transparent observation window 76 from the injection nozzle unit 82 provided at the end portion of the adhesion preventive gas supply path 80, the source gas or the like, which is diffused backward into the temperature observation through hole 72, is prevented from reaching the lower surface of the transparent observation window 76. By this, it is possible to prevent the unnecessary film, which may interfere with an accurate temperature detection, from being deposited on the lower surface. Herein, the Ar gas injected to the lower surface of the transparent observation window 76 flows downward through the temperature observation through hole 72, thereby being discharged into the processing space S through the opening 72A of the lower end while downwardly pushing the source gas, which has been diffused backward in the through hole 72.

As mentioned above, in accordance with the present invention, since the Ar gas for purge is directly injected to the lower surface of the transparent observation window 76, a flow rate of the Ar gas to be supplied becomes very small compared to that of the conventional device. For example, it could be noted that, in the present embodiment, a flow rate of about 3~100 sccm is sufficient, while a large flow rate of about 100 sccm is required in the conventional device to prevent deposition of unnecessary film. Therefore, even though the Ar gas for purge is discharged into the processing space S through the opening 72A of the lower end of the temperature observation through hole 72, in-surface uniformity in the processing, i.e., in-surface uniformity in the film thickness, is not deteriorated since the Ar gas does not partially affect the film thickness on the surface of the wafer W.

Second Embodiment

In the following, a second embodiment of the present invention will be discussed.

Figure 3:
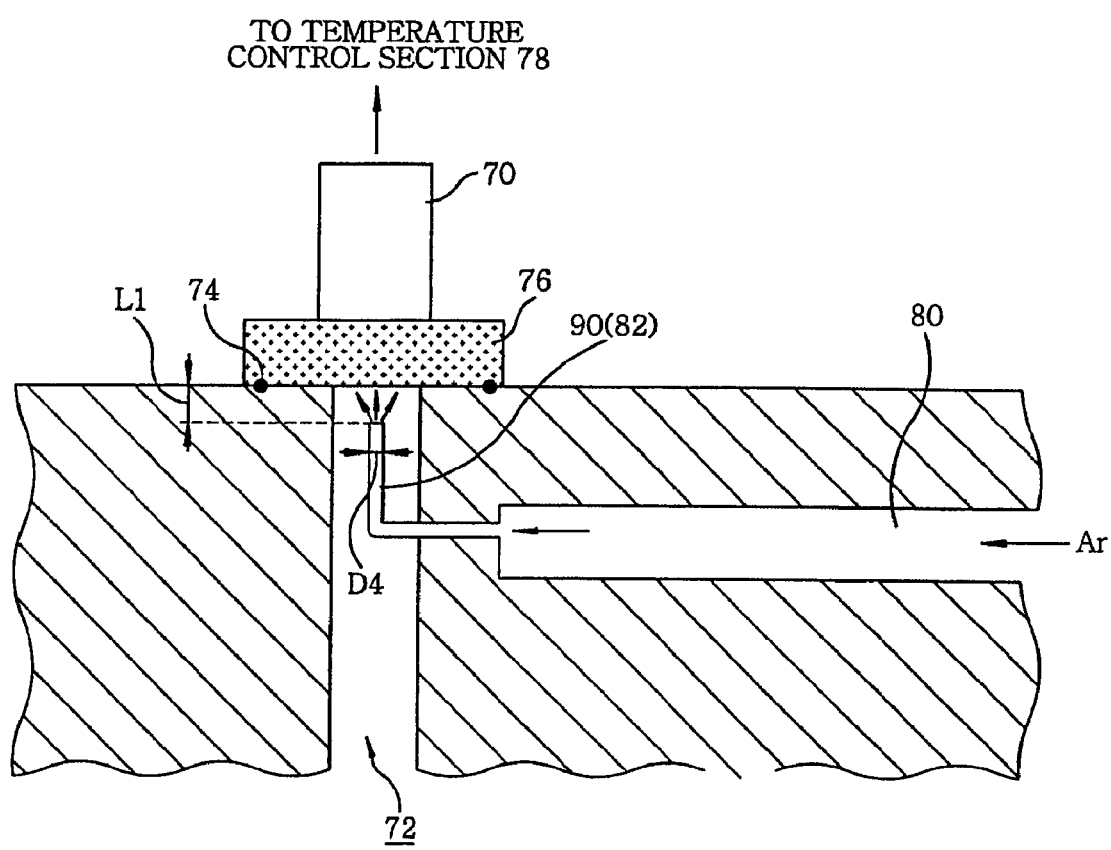
FIG. 3 explains a magnified cross sectional view showing a part of a shower head structure in accordance with a second embodiment of the present invention.

FIG. 3 is a magnified partial cross sectional view showing a part of a shower head structure in accordance with a second embodiment of the invention.

Further, in FIG. 3, identical reference numerals will be used for the parts having substantially same functions as those in FIG. 2, and redundant description thereof will be omitted.

In the first embodiment shown in FIG. 2, the injection nozzle unit 82 at the end portion of the adhesion preventive gas supply path 80 is formed by carrying out a boring processing on the purge injection hole 84. On the other hand, in the second embodiment shown in FIG. 3, the injection nozzle unit 82 is formed by a gas injection pipe made of a heat-resistant transparent material. Specifically, the gas injection pipe 90 is formed by bending, e.g., a transparent slim quartz glass tube to make it have a substantially L-shape; and it is attached to the end portion of the adhesion preventive gas supply path 80 to communicate therewith. A tip end of the gas injection pipe 90 faces toward the transparent observation window 76, in the temperature observation through hole 72. In this case, an inner diameter D4 of the injection nozzle unit 82 (gas injection pipe 90) is set to be substantially same (about 2 ~3 mm) as the inner diameter D3 of the purge injection hole 84 in the first embodiment. Further, it is preferable that a distance L1 between the tip end of the injection nozzle unit 82 and the transparent observation window 76 is made as small as possible, by taking an adhesion prevention efficiency of the unnecessary film into consideration, wherein it is set at, e.g., about 3~13 mm.

In the second embodiment, the same operation effect as that in the first embodiment can be obtained by directly injecting from the gas injection pipe 90 to the lower surface of the transparent observation window 76 the nonreactive gas for purging, e.g., Ar gas, of the same flow rate as in the former first embodiment, e.g., about 3~100 sccm, while the heat treatment being performed on the semiconductor wafer W. Namely, an unnecessary film is not deposited on the lower surface of the transparent observation window 76, and further, in-surface uniformity in the processing of the wafer surface, e.g., in-surface uniformity in the film thickness, is not deteriorated, even though the flow rate of the Ar gas for purge is smaller than that of the conventional device.

In particular, by injecting the Ar gas for purge in the normal direction to the transparent observation window 76, as in the second embodiment, it is possible to further prevent the unnecessary film from being deposited on the lower surface of the transparent observation window 76.

Third Embodiment

In the following, a third embodiment of the present invention will be explained.

Figure 4:
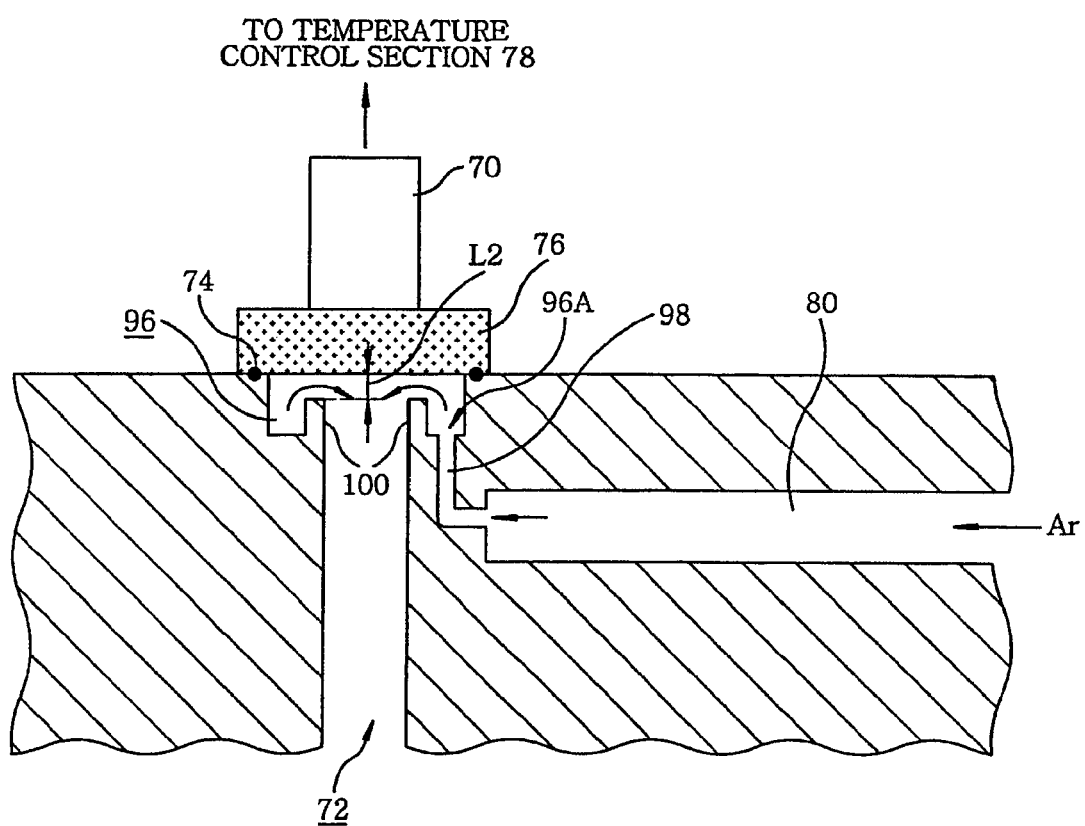
FIG. 4 sets forth a magnified cross sectional view showing a part of a shower head structure in accordance with a third embodiment of the present invention.
Figure 5:
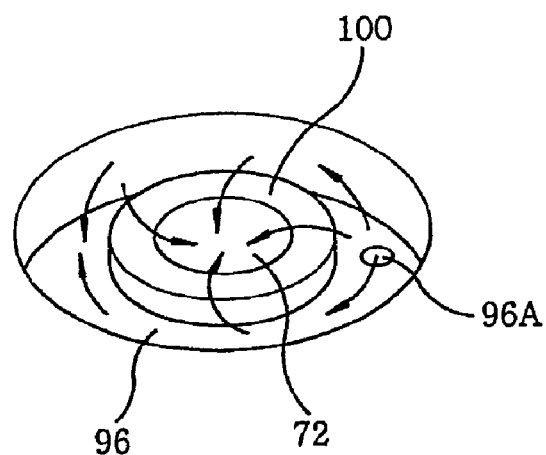
FIG. 5 presents a perspective view showing a gas diffusion groove shown in FIG. 4.
Figure 6:
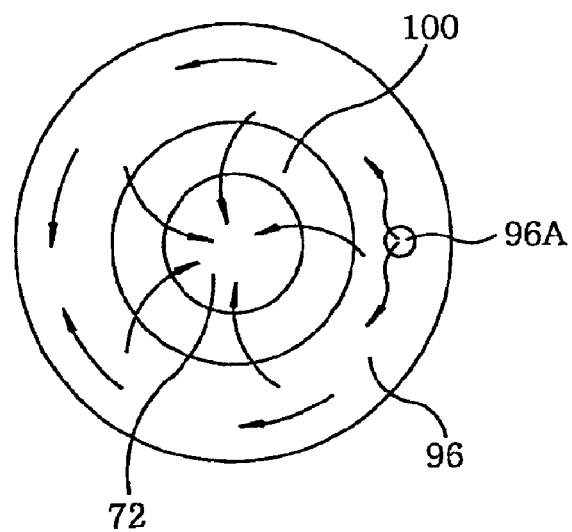
FIG. 6 provides a plane view showing the gas diffusion groove shown in FIG. 4.

FIG. 4 is a magnified cross sectional view showing a part of a shower head structure in accordance with a third embodiment of the invention; FIG. 5 is a perspective view showing a gas diffusion groove shown in FIG. 4; and FIG. 6 is a plane view showing the gas diffusion groove shown in FIG. 4. Further, in FIG. 4, identical reference numerals will be used for the parts having substantially same functions as those in FIGS. 2 and 3, and redundant description thereof will be omitted.

In the third embodiment shown in FIG. 4, at the upper portion of the temperature observation through hole 72, a circular ring-shaped gas diffusion groove 96 is formed to enlarge the radius of the temperature observation through hole 72. The transparent observation window 76 is attached to airtightly shut the entire gas diffusion groove 96. Further, a hole 96A formed at a bottom portion of the gas diffusion groove 96 communicates with the upper portion of the adhesion preventive gas supply path 80 through a gas hole 98 of a small inner diameter. Accordingly, the Ar gas supplied into the adhesion preventive gas supply path 80 comes to flow in the gas diffusion groove 96 through the gas hole 98. A cross section of the gas diffusion groove 96 is of a recess shape.

Specifically, an inner wall of the gas diffusion groove 96 is formed as a ring-shaped inner bank 100, provided to be separated from the lower surface of the transparent observation window 76 by some distance.

Therefore, it is configured such that the nonreactive gas supplied into the gas diffusion groove 96 is made to get over the inner bank 100, thereby flowing into the temperature observation through hole 72, while being diffused in the circumferential direction of the gas diffusion groove 96. A distance L2 between an upper portion of the inner bank 100 and the lower surface of the transparent observation window 76 is set to be within a range of about, e.g., 1~5 mm, in case where the diameter D1 of the temperature observation through hole 72 is 13 mm. Further, as the diameter D1 becomes larger, the distance L2 may be increased accordingly.

In the third embodiment, the same operation effects as those in the first and the second embodiment can be obtained by allowing the nonreactive gas for purging, e.g., Ar gas, of the same flow rate as that in the former first or second embodiment, e.g., about 3~100 sccm, to have a contact with the lower surface of the transparent observation window 76 through the gas diffusion groove 96, while performing the heat treatment on semiconductor wafer. Namely, the Ar gas, which is supplied into the gas diffusion groove 96 through the gas hole 98 via the adhesion preventive gas supply path 80, gets over the inner bank 100, thereby flowing into the temperature observation through hole 72, while being diffused in the circumferential direction of the gas diffusion groove 96 (along the peripheral portion of the transparent observation window 76). Herein, when the Ar gas gets over the inner bank 100, the Ar gas makes a contact with the lower surface of the transparent observation window 76. Accordingly, the source gas or the like can be prevented from making a contact with the lower surface. Therefore, an unnecessary film is not deposited on the lower surface of the transparent observation window 76, and further, in-surface uniformity in the processing of the wafer surface, e.g., in-surface uniformity in the film thickness, is not deteriorated, even though the flow rate of Ar gas for purge is smaller than that of the conventional device.

Fourth Embodiment

In the following, a fourth embodiment of the present invention will be discussed.

Figure 7:
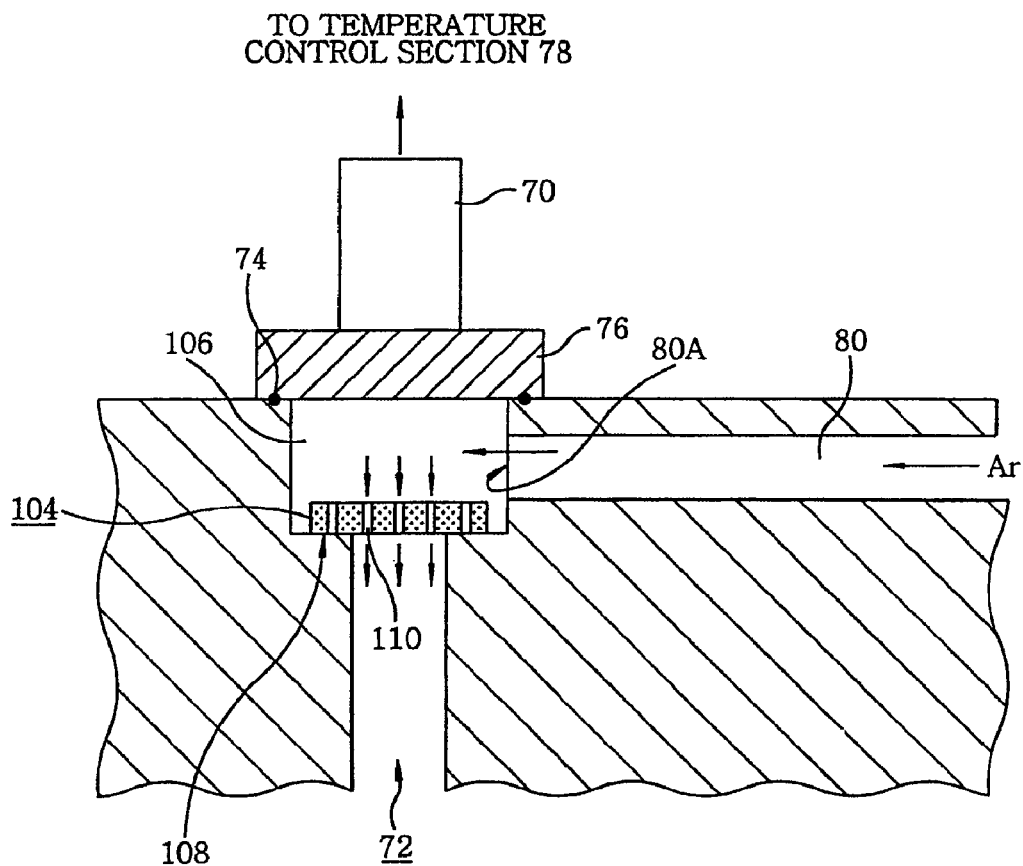
FIG. 7 describes a magnified cross sectional view showing a part of a shower head structure in accordance with a fourth embodiment of the present invention.
Figure 8:
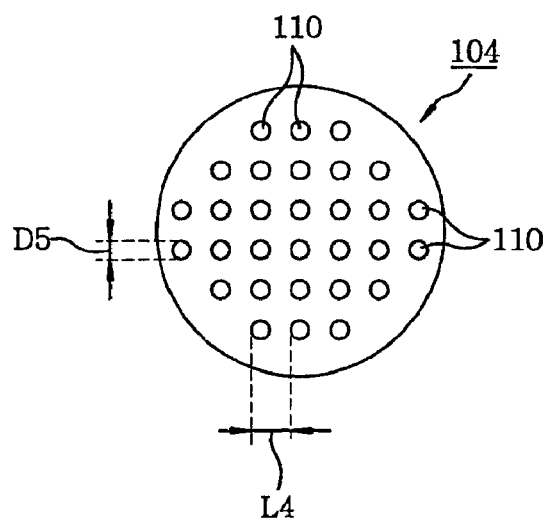
FIG. 8 depicts a magnified plane view showing a gas backflow prevention plate shown in FIG. 7.

FIG. 7 is a magnified cross sectional view showing a part of a shower head structure in accordance with a fourth embodiment of the invention; and FIG. 8 is a magnified plane view showing a gas backflow prevention plate shown in FIG. 7. Further, in FIG. 7, identical reference numerals will be used for the parts having substantially same functions as those in FIGS. 2 to 4, and redundant description thereof will be omitted.

In the fourth embodiment shown in FIG. 7, a gas outlet 80A of an adhesion preventive gas supply path 80 is opened to a temperature observation through hole 72; and a gas backflow prevention plate 104 is installed in the temperature observation through hole 72 at a downstream side of the gas outlet 80A.

Specifically, at an upper portion of the temperature observation through hole 72, there is installed a diffusion area 106 as a step portion, the diameter of which is larger than that of the temperature observation through hole 72. A transparent observation window 76 is airtightly installed to seal an upper portion of the diffusion area 106. Further, the gas outlet 80A of the adhesion preventive gas supply path 80 is formed in the sidewall of the diffusion area 106. Accordingly, a nonreactive gas is introduced into the diffusion area 106. Further, the gas backflow prevention plate 104 is installed at a bottom portion (step portion) 108 of the diffusion area 106, corresponding to a downstream side of the gas outlet 80A, to cover the cross section of the temperature observation through hole 72. The gas backflow prevention plate 104 is made of a heat-resistant transparent material, e.g., quartz glass, to transmit heat rays from the wafer W. Over the entire surface of the gas backflow prevention plate 104, multiple fine gas injection holes 110 penetrating therethrough in the vertical direction are formed by, e.g., a boring processing. Thus, the source gas or the like is not backwardly diffused above the gas backflow prevention plate 104. In this case, the thickness of the gas backflow prevention plate 104 is about 2~3 mm; the fine gas injection holes 110 are substantially uniformly distributed, wherein an inner diameter D5 thereof is about 0.5~2 mm; and a pitch L4 between the fine gas injection holes 110 is about 2~6 mm, an opening ratio of which is set within the range of 0.6~60%, as shown in FIG. 8. Therefore, the nonreactive gas introduced into the diffusion area 106 is downwardly injected through the fine gas injection holes 110 of the gas backflow prevention plate 104 at a somewhat higher flow speed. Further, the gas backflow prevention plate 104 may be provided at a further downstream side (in the lower direction in FIG. 7) of the temperature observation through hole 72.

In the fourth embodiment, the same operation effects can be also obtained as those in the former first to third embodiments by injecting the nonreactive gas for purge at the same flow rate as in the former first to third embodiments, e.g., about 3~100 sccm, while performing the heat treatment on semiconductor wafer W. Namely, the nonreactive gas, e.g., Ar gas, supplied into the diffusion area 106 through the adhesion preventive gas supply path 80 flows downward in a shower shape through the multiple fine gas injection holes 110 provided at the entire surface of the gas backflow prevention plate 104, thereby running through the temperature observation through hole 72 while being diffused in the diffusion area 106. Hence, it is possible to prevent the source gas or the like from being diffused backward, and particularly, to prevent it from penetrating in the upper direction above the gas backflow prevention plate 104. Further, the fine gas injection holes 110 are uniformly dispersed over the entire surface of the gas backflow prevention plate 104 at a proper pitch, and the source gas or the like is pushed to flow in the downward direction by the force of the Ar gas, which flows downward through the respective fine gas injection holes 110. Thus, the source gas or the like is prevented from making a contact with the lower surface of the gas backflow prevention plate 104, so that it is possible to prevent an unnecessary film, causing a decrease in the heat ray transmittance, from being deposited on the lower surface. Hence, the unnecessary film is not deposited on the lower surface of the transparent observation window 76, and further, in-surface uniformity in the processing of the wafer surface, e.g., in-surface uniformity in the film thickness, is not deteriorated, even though the flow rate of Ar gas for purge is smaller than that of the conventional device.

Fifth Embodiment

In the following, a fifth embodiment will be discussed.

Figure 9:
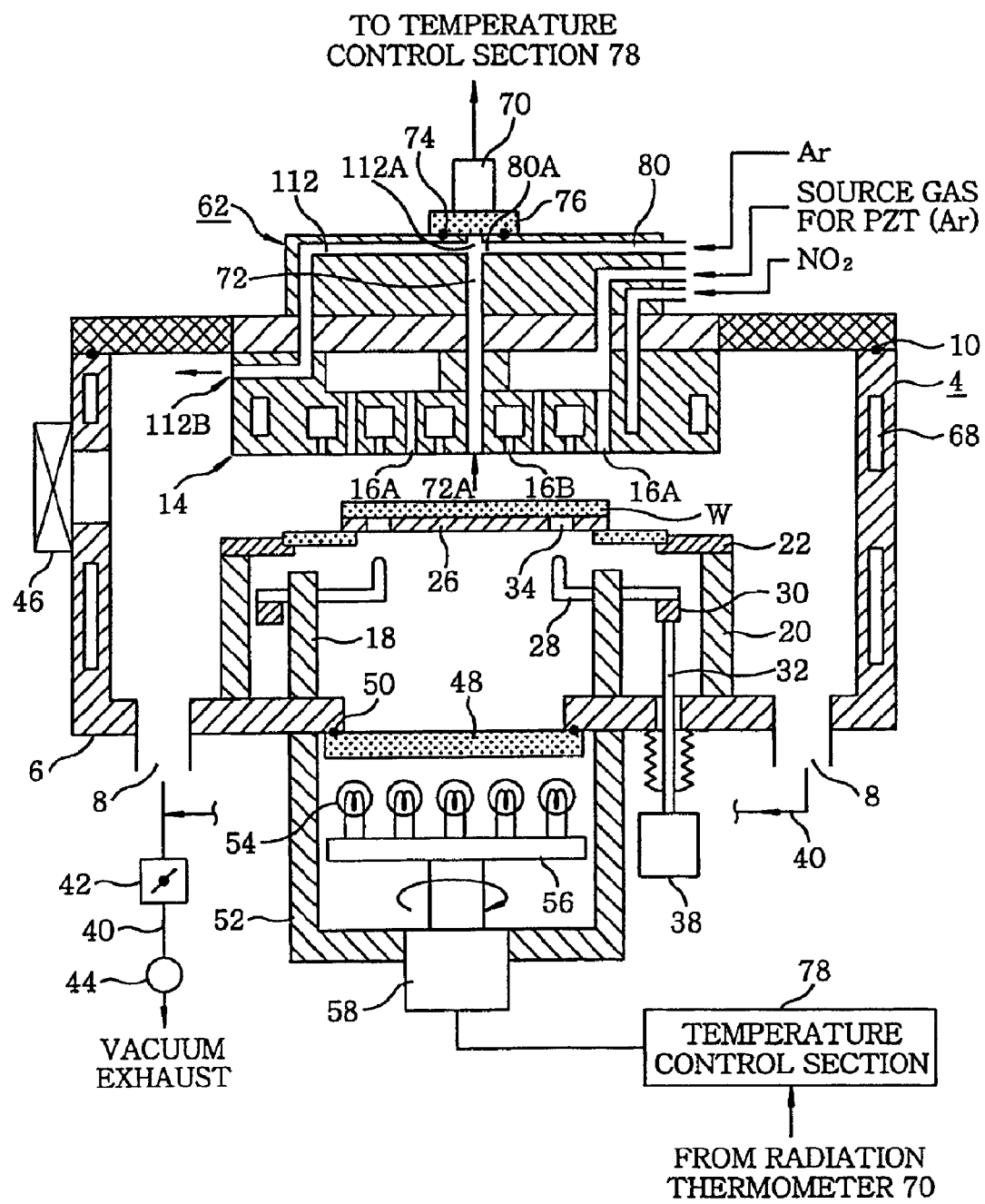
FIG. 9 describes a cross sectional configuration view showing a processing device having a shower head structure in accordance with a fifth embodiment of the present invention.
Figure 10:
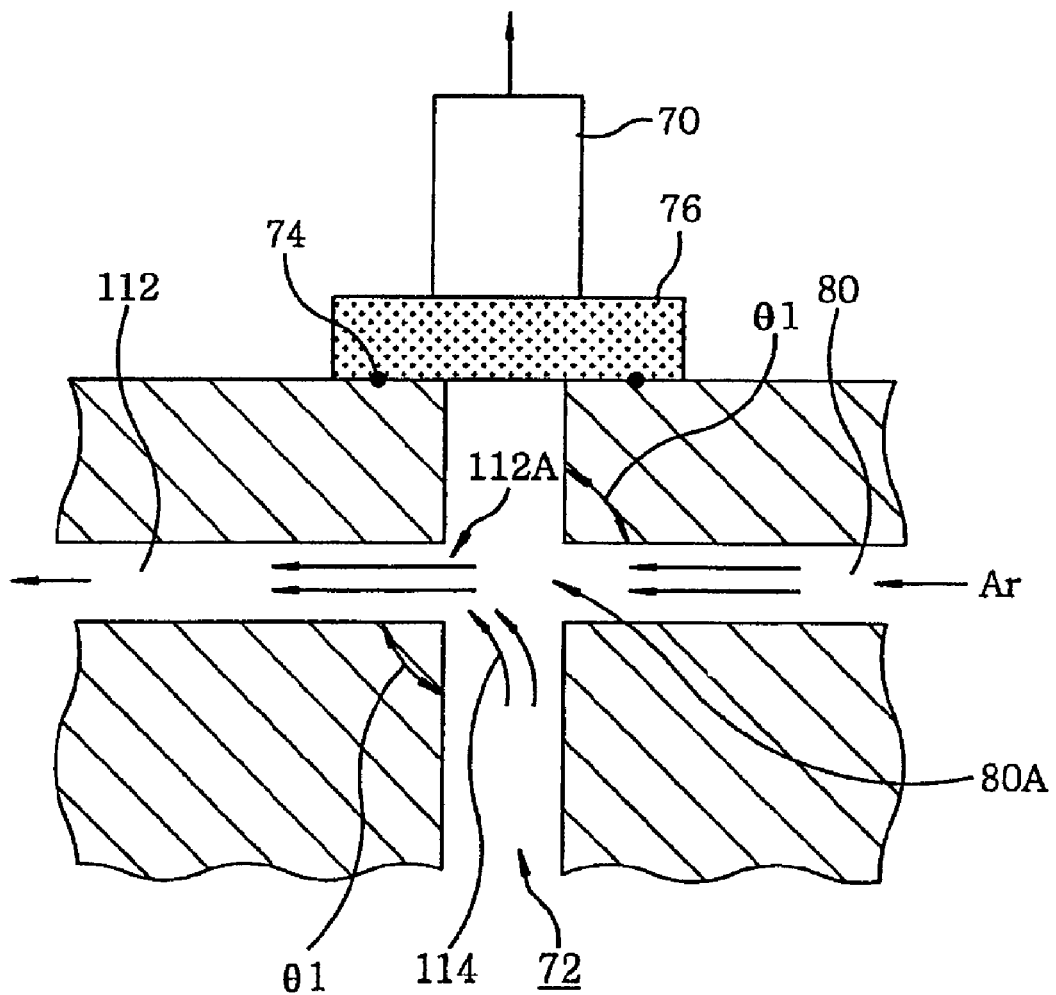
FIG. 10 offers a magnified cross sectional view showing a part of the shower head structure shown in FIG. 9.

FIG. 9 is a cross sectional configuration view showing a processing device having a shower head structure in accordance with the fifth embodiment of the present invention; and FIG. 10 is a magnified cross sectional view showing a part of the shower head structure shown in FIG. 9. Further, herein, identical reference numerals will be used for the parts having substantially same functions as those in FIGS. 1 to 8, and redundant description thereof will be omitted.

In the first to fourth embodiments explained above, the nonreactive gas introduced into the temperature observation through hole 72 is discharged toward the processing space S above the wafer W through the opening 72A (see FIG. 1) of the lower portion. However, in the present embodiment, the nonreactive gas introduced into the temperature observation through hole 72 is not discharged into the processing space S.

Namely, in the fifth embodiment shown in FIGS. 9 and 10, the adhesion preventive gas supply path 80 communicates with the temperature observation through hole 72 through the gas outlet 80A (see FIG. 7) formed in a partition wall of the temperature observation through hole 72. Further, in the partition wall for partitioning the temperature observation through hole 72, an outlet port 112A for discharging the nonreactive gas supplied through the gas outlet 80A is formed. A gas exhaust passage 112 for guiding the nonreactive gas discharged through this outlet port 112A is formed in the shower head section 62. In such a case shown in FIG. 9, the gas exhaust passage 112 is formed in the shower head section 62 to be bent therein. A gas outlet 112B of the gas exhaust passage 112 is provided in the sidewall of the lower portion of the shower head section 62. Accordingly, the nonreactive gas is discharged into the treating vessel 4 through the gas outlet 112B. In this case, the extension direction of the gas exhaust passage 112 in the vicinity of the gas outlet 112B, i.e., the injection direction of the nonreactive gas, is set to head for the outside of the surface of the wafer W, to prevent the film thickness of the wafer surface from being affected by an injecting power of the nonreactive gas.

In this case, it is preferable that the adhesion preventive gas supply path 80 and the gas exhaust passage 112 are formed along a straight line, as illustrated in FIG. 10, in a part opened in the temperature observation through hole 72. Thus, the nonreactive gas supplied into the temperature observation through hole 72 through the adhesion preventive gas supply path 80 can be discharged to the gas exhaust passage 112 side in such a same state. Namely, an air curtain of the nonreactive gas is formed in the cross sectional direction of the temperature observation through hole 72. Therefore, it is possible to prevent the source gas or the like from penetrating into the transparent observation window 76 side.

For preventing the nonreactive gas from flowing along the temperature observation through hole 72 as much as possible, it is preferable that the adhesion preventive gas supply path 80 and the gas exhaust passage 112 are disposed on a straight line, as described above, and further, an angle θ1 formed by the paths 80 and 112 and the temperature observation through hole 72 is within the range of 45~90 degrees. Particularly, as illustrated in FIG. 10, the angle θ1 is preferably set at 90 degrees.

Further, for preventing the nonreactive gas from flowing along the temperature observation through hole 72 as much as possible, it is preferable that an inner diameter of the adhesion preventive gas supply path 80 is set to be substantially identical to that of the gas exhaust passage 112; and the inner diameter is set to be substantially identical to that of the temperature observation through hole 72, and preferably, e.g., about 13 mm.

In the fifth embodiment, while the heat treatment being performed on the semiconductor wafer W, the nonreactive gas, e.g., Ar gas, flows through the adhesion preventive gas supply path 80 such that the Ar gas runs across the temperature observation through hole 72 from the gas outlet 80A, thereby flowing into the gas exhaust passage 112 through the outlet port 112A provided to face the gas outlet 80A. Thereafter, the Ar gas passes the gas exhaust passage 112 to flow into the treating vessel 4 through the gas outlet 112B (see FIG. 9).

Herein, as indicated by arrows 114 in FIG. 10, the source gas or the like, which has been diffused backward into the temperature observation through hole 72, is swept away along the Ar gas to be discharged towards the gas exhaust passage 112. For the same reason, the source gas or the like is prevented from reaching the transparent observation window 76 disposed at a further upper position, and therefore, an unnecessary film absorbing heat rays is prevented from being deposited on the lower surface of the transparent observation window 76.

Further, the Ar gas for purge to be supplied is mostly discharged through the gas exhaust passage 112 to a region where any influence therefrom will not affect the film thickness on the wafer surface. That is, it is possible to make almost no Ar gas for purge to be introduced into the processing space S through the opening 72A of the lower end of the temperature observation through hole 72. Thus, in-surface uniformity in the processing on the wafer surface, e.g., in-surface uniformity in the film thickness, is hardly deteriorated.

Still further, in the fifth embodiment, since almost all Ar gas for purge is efficiently exhausted through the gas exhaust passage 112, it is possible to make almost no Ar gas for purge to be introduced into the processing space S through the opening 72A of the lower end of the temperature observation through hole 72, even though the amount of Ar gas to be supplied is set to be larger than that of the conventional device. Therefore, in-surface uniformity in the processing on the wafer surface, e.g., in-surface uniformity in the film thickness, is hardly deteriorated.

Sixth and Seventh Embodiments

Figure 11:
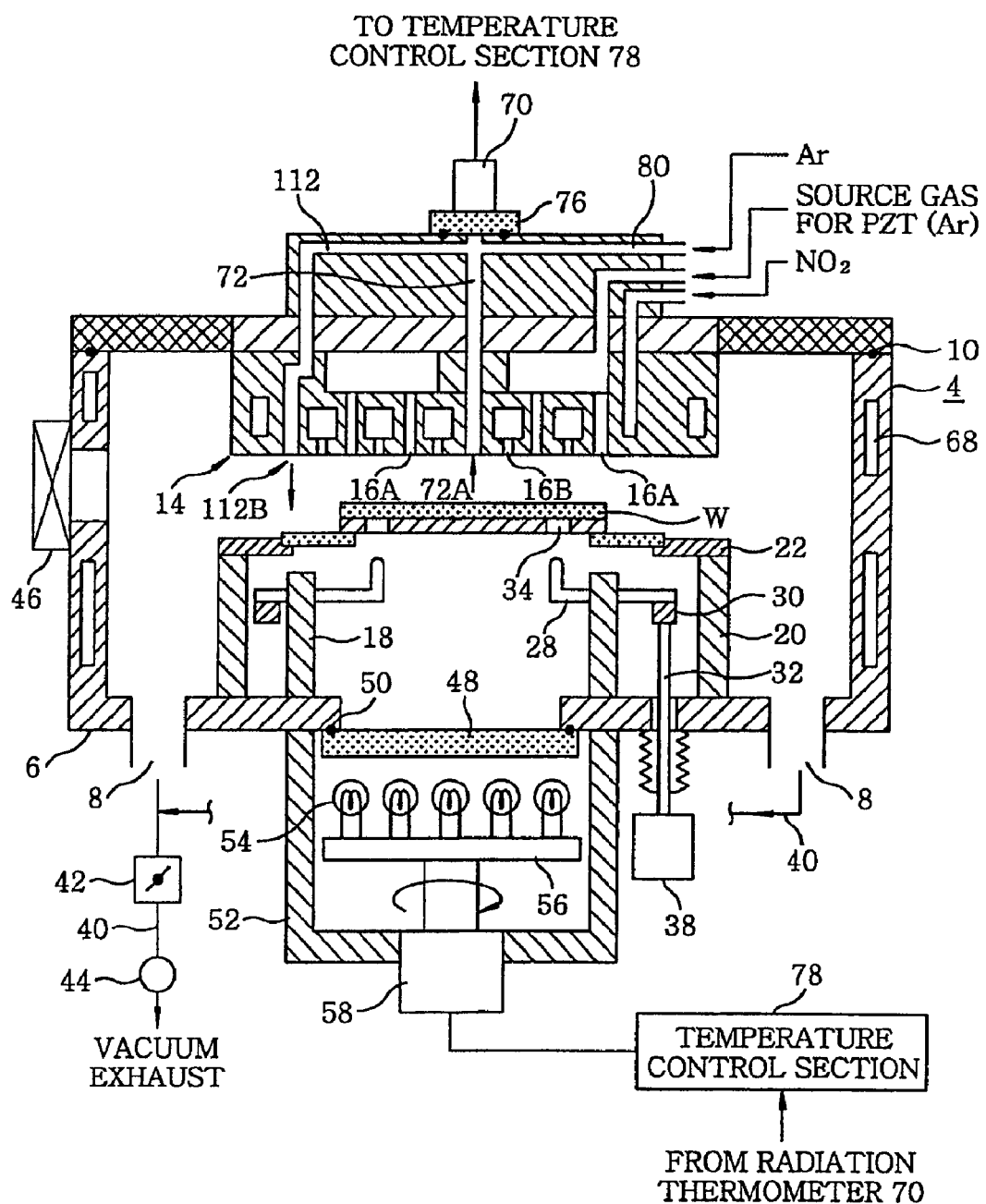
FIG. 11 shows a cross sectional view showing a processing device having a shower head structure in accordance with a sixth embodiment of the present invention.

In the fifth embodiment, the gas outlet 112B of the gas exhaust passage 112 is provided in the side of the shower head section 62, but it is not limited thereto. For example, as in the sixth embodiment shown in FIG. 11, the gas outlet 112B may be provided at a peripheral portion of the gas injection surface 14 such that the extension direction of the gas exhaust passage 112 in the vicinity of the gas outlet 112B heads for the outside of the surface of the wafer W. In this case also, the Ar gas discharged through the gas outlet 112B does not partially affect the film thickness on the surface of the wafer W.

Figure 12:
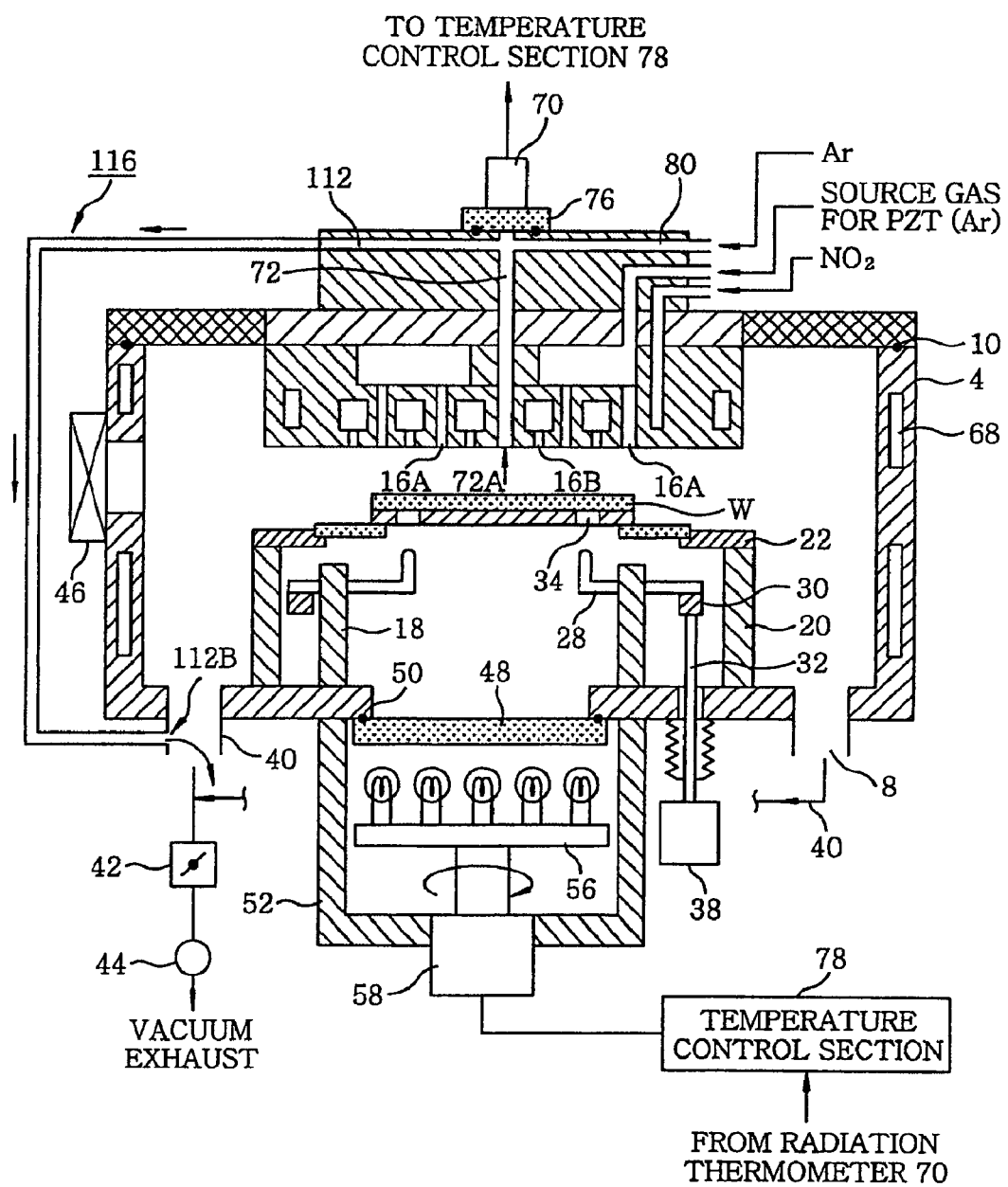
FIG. 12 sets forth a cross sectional view showing a processing device having a shower head structure in accordance with a seventh embodiment of the present invention.

Alternatively, as in the seventh embodiment shown in FIG. 12, it may be configured such that a part of the gas exhaust passage 112 is formed by an auxiliary line 116, and the gas outlet 112B of a tip end of the auxiliary line 116 communicates with an upstream side portion of the pressure control valve 42 of an exhaust passage 40 outside the treating vessel 4. In this case, it is possible to substantially completely prevent the nonreactive gas for purge from affecting the film thickness on the surface of the wafer W. Further, in FIGS. 11 and 12, identical reference numerals will be used for corresponding parts having substantially same functions as in the fifth embodiment shown in FIG. 9, and redundant description thereof will be omitted.

Eighth and Ninth Embodiments

In the following, an eighth and ninth embodiments will be explained.

In the first to seventh embodiments, the temperature observation through hole 72 is provided along the vertical direction normal to the wafer surface. However, it is not limited thereto. For example, as in the eighth embodiment shown in FIG. 13, the temperature observation through hole 72 may be tilted by an angle $\theta 2$ with respect to the vertical direction. In this case also, it is preferable that the angle $\theta 1$ formed by the adhesion preventive gas supply path along with the gas exhaust passageway 112 and the temperature observation through hole 72 is set within the range of 45 degrees~90 degrees, as described above. Further, in this case also, it is preferable that the extension direction of the gas exhaust passage 112 in the vicinity of the gas outlet 112B heads for the outside of the surface of the wafer W.

Figure 14:
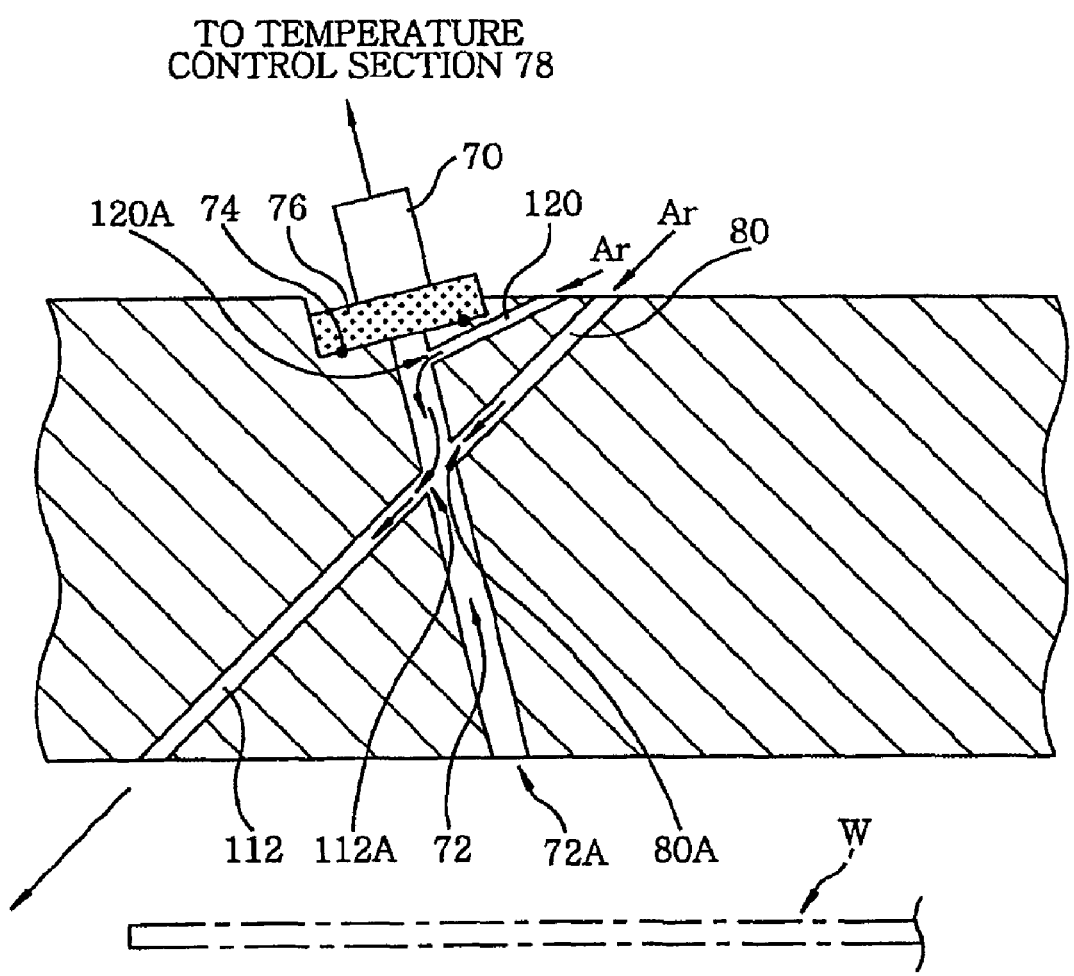
FIG. 14 provides a cross sectional view showing a part of a shower head structure of a processing device in accordance with a ninth embodiment of the present invention.

Further, as in the ninth embodiment shown in FIG. 14, it can be configured that one or more (one in the drawing) second adhesion preventive gas supply paths 120 as well as the adhesion preventive gas supply path 80 are additionally provided to supply the nonreactive gas, e.g., Ar gas, whose respective flow rates are controlled, through the plural gas outlets 80A and 120A into the temperature observation through hole 72. In this case, a gas supply port 120A of the second adhesion preventive gas supply path 120 is provided above (i.e., at a side close to the transparent observation window 76) the gas supply port 80A facing the outlet 112A of the gas exhaust passage 112. Namely, the second adhesion preventive gas supply path 120 is provided at a side close to the transparent observation window 76.

In this case, the flow rate of the Ar gas passing through the second adhesion preventive gas supply path 120 is set to be smaller, e.g., 1~10 sccm, than that of the Ar gas flowing through the adhesion preventive gas supply path 80, e.g., 3~100 sccm. In accordance with the present embodiment, the nonreactive gas for purge, which is supplied through the second adhesion preventive gas supply path 120, flows downward slightly into the temperature observation through hole 72; and it is discharged through the gas exhaust passage 112 with the nonreactive gas supplied through the adhesion preventive gas supply path 80.

Thus, even in case where the source gas or the like penetrates through the air curtain formed by the nonreactive gas supplied from the adhesion preventive gas supply path 80 to be further diffused upward, it is pushed to be turned back by the nonreactive gas, running downward through the temperature observation through hole 72 from the second adhesion preventive gas supply path 120. Therefore, it is possible to more securely prevent an unnecessary film from being deposited on the lower surface of the transparent observation window 76, and further, to improve in-surface uniformity in the film thickness formed on the surface of the wafer W.

Figure 13:
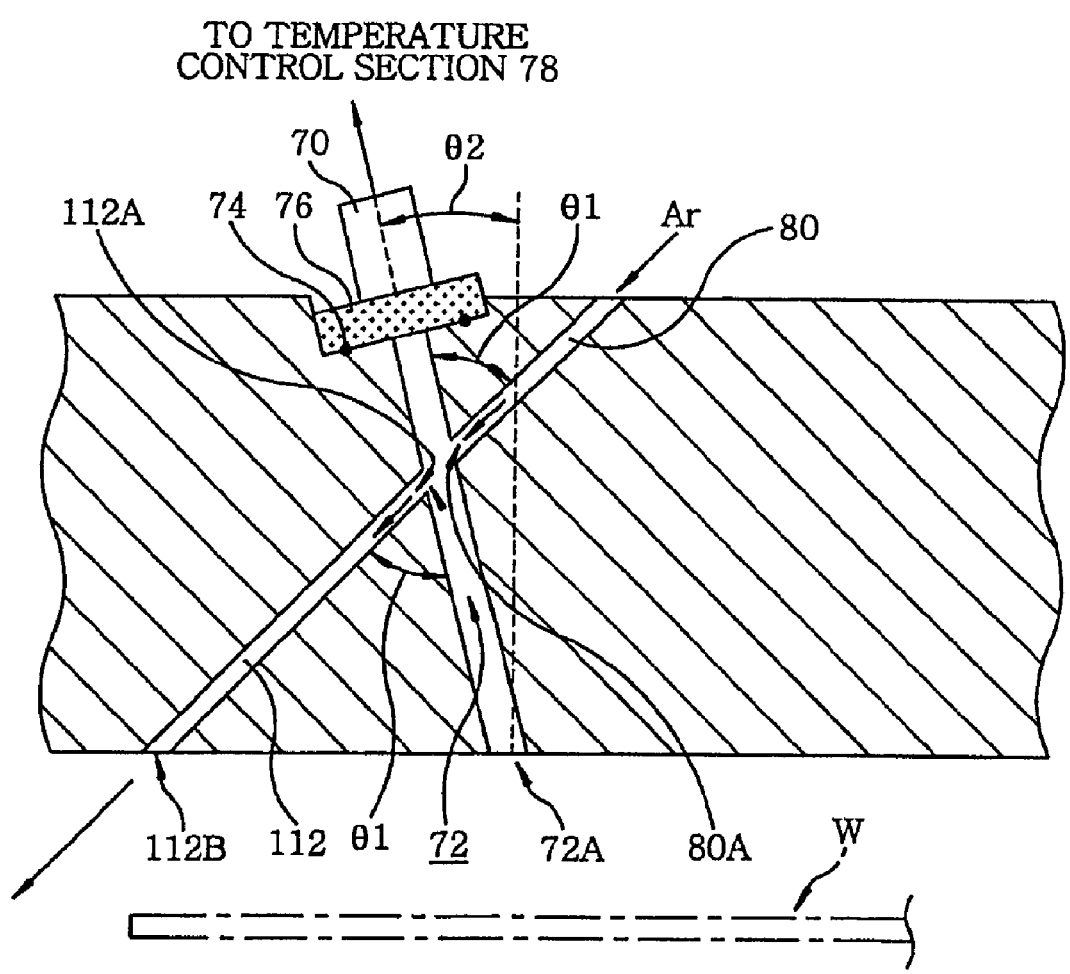
FIG. 13 presents a cross sectional view showing a part of a shower head structure of a processing device in accordance with an eighth embodiment of the present invention.

Further, in FIGS. 13 and 14, other inner structures of the shower head section 62 are not shown. Still further, in FIG. 14, identical reference numerals will be used for corresponding parts having substantially same functions as those in FIG. 13, and redundant description thereof will be omitted.

Tenth and Eleventh Embodiments

Figure 15:
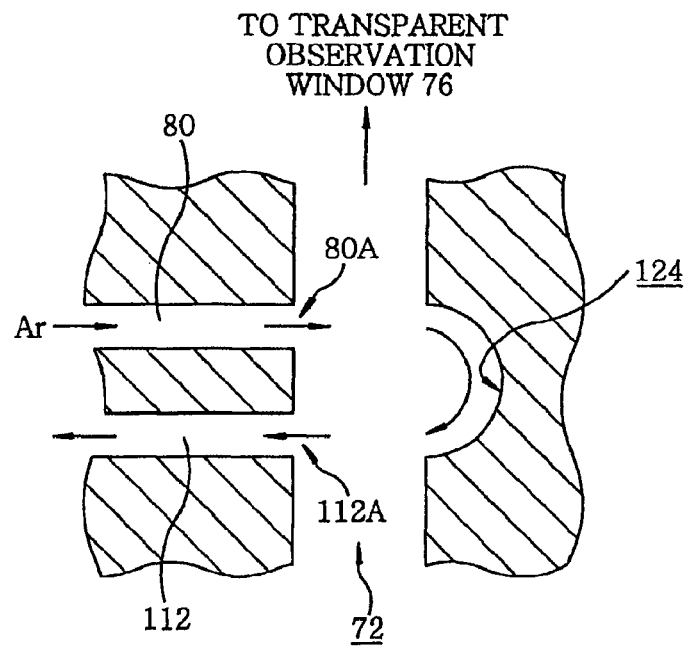
FIG. 15 is a partially magnified longitudinal cross sectional view showing a part of a shower head structure in accordance with a tenth embodiment of the present invention.
Figure 16:
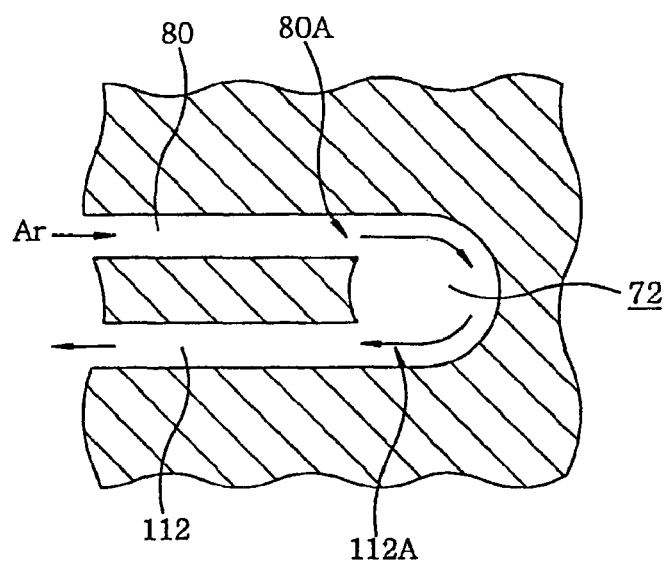
FIG. 16 is a partially magnified transverse cross sectional view of a shower head structure in accordance with an eleventh embodiment of the present invention.

In the following, a tenth and an eleventh embodiment of the present invention will be explained. FIG. 15 is a partially magnified longitudinal cross sectional view showing a part of a shower head structure in accordance with a tenth embodiment of the present invention; and FIG. 16 is a partially magnified transversal cross sectional view of a shower head structure in accordance with an eleventh embodiment of the present invention.

In the fifth to ninth embodiments explained above, the adhesion preventive gas supply path 80 and the gas exhaust passage 112 are disposed along a straight line at an intersection portion (contact portion) with the temperature observation through hole 72, but it is not limited thereto.

For example, as in the tenth embodiment shown in FIG. 15, the adhesion preventive gas supply path 80 and the gas exhaust passage 112 may be formed, e.g., in parallel to each other with a predetermined gap therebetween. Further, in a partition wall of the temperature observation through hole 72, there may be provided a substantially hemisphere-shaped gas guiding recess portion 124 to face the gas supply port 80A of the adhesion preventive gas supply path 80 and the outlet 112A of the gas exhaust passage 112. In this case, the nonreactive gas for purging, which is discharged through the gas supply port 80A, flows along the gas guiding recess portion 124 to reverse the flow direction thereof, thereby, being discharged via the gas exhaust passage 112 through the outlet 112A.

In this case also, the source gas or the like, which is diffused backward into the temperature observation through hole 72, is swept away with the nonreactive gas for purging, e.g., Ar gas to be discharged from the gas exhaust passage 112. Therefore, it is possible to prevent the unnecessary film from being deposited on the lower surface of the transparent observation window 76 (not shown in FIG. 15).

Further, the nonreactive gas supplied into the temperature observation through hole 72 is mostly exhausted from the gas exhaust passage 112 such that the nonreactive gas is not discharged through the opening of the lower end of the temperature observation through hole 72 into the processing space, and thus, not partially affecting the film thickness on the surface of the wafer W.

Still further, in the eleventh embodiment shown in FIG. 16, the adhesion preventive gas supply path 80 and the gas exhaust passage 112 are horizontally provided in parallel to each other, so that the flow direction of the nonreactive gas is reversed by a curved surface formed in the partition wall of the temperature observation through hole 72. In this case also, the same operation effect as that in the tenth embodiment shown in FIG. 15 can be obtained.

Heretofore, the respective embodiments have been explained individually, but they may be employed by properly being combined. Further, the gas flow rate or the inner diameter and the like of each passage explained above in the respective embodiments are mere example, and they are not limited to values thereof.

Further, as a nonreactive gas, e.g., N₂ gas, He gas or the like other than Ar gas may be used.

Still further, in the respective embodiments, the nonreactive gas is supplied into the temperature observation through hole 72, but any film forming gas among plural film forming gases (processing gases) to be used may be supplied.

Still further, in the respective embodiments, the nonreactive gas is supplied in the vicinity of the transparent observation window 76, but the gas may be supplied in the vicinity of the gas injection surface 14.

Still further, while the semiconductor wafer as an object to be processed has been explained as an example, an LCD substrate, a glass substrate or the like may be employed.

Still further, a film forming processing of a PZT film has been explained as a heat treatment, but it is not limited thereto. The present invention is applicable to a film forming processing of a different kind of film, or a different heat treatment.

While the invention has been shown and described with respect to the preferred embodiments, it will be understood by those skilled in the art that various changes and modifications may be made without departing from the scope of the invention as defined in the following claims.

What is claimed is:

1. A shower head structure comprising:
a shower head section provided to face a top surface of a mounting table in an evacuatable treating vessel;
a multiplicity of gas injection holes, opened in a lower surface of the shower head section, that inject a processing gas into the treating vessel;
a temperature observation through hole opened in the lower surface of the shower head section to face the top surface of the mounting table;
a transparent observation window that airtightly seals an upper portion of the temperature observation through hole;
a radiant thermometer provided at a top surface side of the transparent observation window; and
an adhesion preventive gas supply path, communicating with the temperature observation through hole, that supplies thereinto an adhesion preventive gas, which prevents a film from being deposited on the transparent observation window,
wherein a gas flow prevention plate, made of a transparent material and that prevents a back flow of a gas, is installed below a gas outlet, in which the adhesion preventive gas supply path communicates with the temperature observation through hole,
wherein a diffusion area is provided at an upper portion of the temperature observation through hole,
wherein the gas outlet, in which the adhesion preventive gas supply path communicates with the temperature observation through hole, is provided at a sidewall of the diffusion area, and
wherein the gas flow prevention plate is installed at a bottom portion of the diffusion area;
wherein the adhesion preventive gas supplied into the temperature observation through hole prevents the processing gas from reaching a lower surface of the transparent observation window,
wherein the gas flow prevention plate is provided in the temperature observation through hole between an opening of the temperature observation through hole in the lower surface of the shower head section and the gas outlet, in which the adhesion preventive gas supply path communicates with the temperature observation through hole,
wherein, in the gas flow prevention plate, plural fine gas injection holes are formed, and
wherein the adhesion preventive gas is a nonreactive gas.

2. The shower head structure of claim 1, wherein the gas flow prevention plate is made of a quartz glass.

3. The shower head structure of claim 1, wherein the shower head structure further comprises a head space supplying the processing gas to the gas injection holes, and
wherein an inside of the temperature observation through hole is airtightly separated from the head space.

4. The shower head structure of claim 1, wherein a flow rate of the adhesion preventive gas supplied into the temperature observation through hole is 3 to 100 sccm.

* * * * *